Sept. 28, 1965 R. E. WENDT, JR 3,209,163

SEMICONDUCTOR LOGIC CIRCUIT

Filed July 7, 1961 2 Sheets-Sheet 1

INVENTOR
Richard E. Wendt, Jr.
BY Ernest P. Klipfel
ATTORNEY

United States Patent Office 3,209,163
Patented Sept. 28, 1965

3,209,163

SEMICONDUCTOR LOGIC CIRCUIT

Richard E. Wendt, Jr., Edgewood, Pa., assignor to Westinghouse Electric Corporation, East Pittsburgh, Pa., a corporation of Pennsylvania Filed July 7, 1961, Ser. No. 122,455
13 Claims. (Cl. 307—88.5)

The present invention relates generally to semiconductor logic circuits and more particularly relates to a circuit utilizing semiconductor devices exhibiting the phenomena of quantum mechanical tunneling to provide the NOR logic function.

The advent of tunnel diodes and other semiconductor devices exhibiting similar ampere-voltage characteristics has provided many attractive properties for their use in circuits performing logic functions. The high speed with which switching can occur, their low power consumption, small size and relative insensitivity to environmental conditions are all important features in a logic module.

An object of the present invention is to provide a logic circuit utilizing semiconductor devices exhibiting the phenomena of quantum-mechanical tunneling.

Another object of the present invention is to provide a logic circuit for performing the NOR logic function.

Another object of the present invention is to provide a logic circuit having unilateral signal flow properties.

Another object of the present invention is to provide a logic circuit which can be economically fabricated of dendritic material.

Further objects and advantages of the present invention will be readily apparent from the following detailed description taken in conjunction with the drawing in which.

Figure 1:
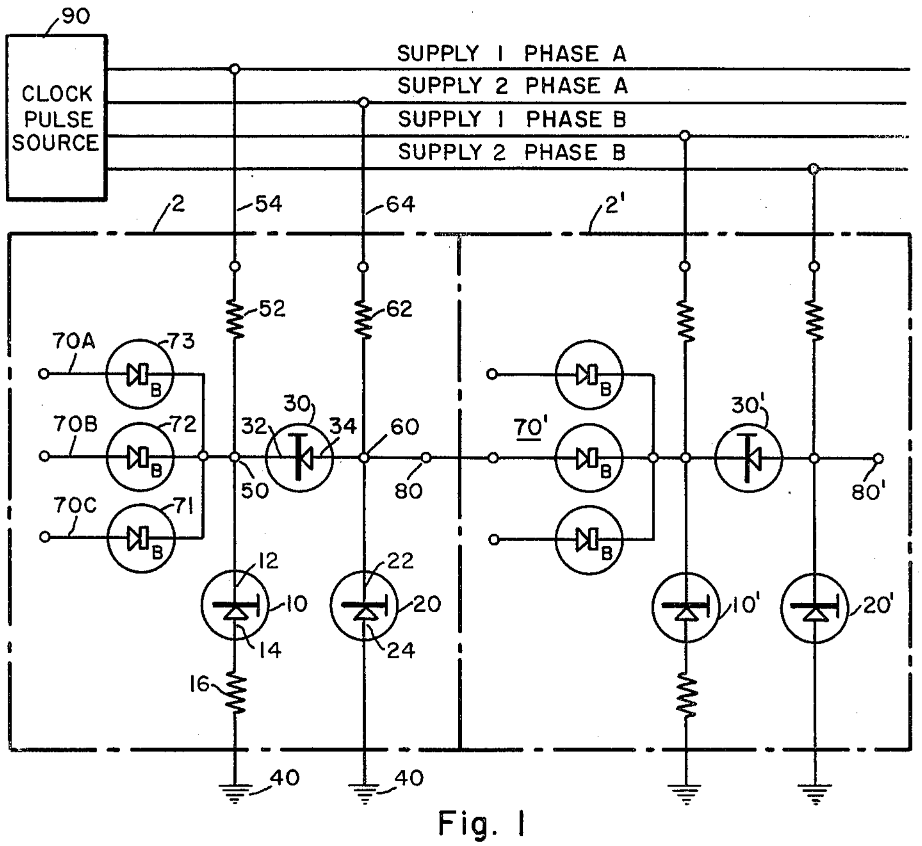
FIGURE 1 is an electrical schematic diagram of an illustrative embodiment of the present invention.

FIG. 1 illustrates the present invention embodied in a logic net wherein a couple of NOR logic modules or circuits 2 and 2′ are shown for purposes of clarity. The logic circuit 2 is identical with the other circuit 2′ with the devices therein being assigned identical but primed reference characters.

The NOR logic circuit 2 comprises generally a first tunnel diode 10 and a second tunnel diode 20, each having one element hereinafter referred to as its cathode 12 and 22, respectively, connected through a third tunnel diode 30. The opposite element of each diode 10, 20, hereinafter referred to as the anode 14 and 24, respectively, is commonly connected to a point of reference potential 40. The anode 14 is so connected through a resistive element 16. The tunnel diode 30 is poled so that its cathode 32 is connected to the cathode 12 at a junction 50 and its anode 34 is connected to the cathode 22 at a junction 60.

A resistance 52 provides means for connecting a first supply line 54 to the junction 50. A resistance 62 provides means for connecting a second supply line 64 to the junction 60.

Figures 3, 4:
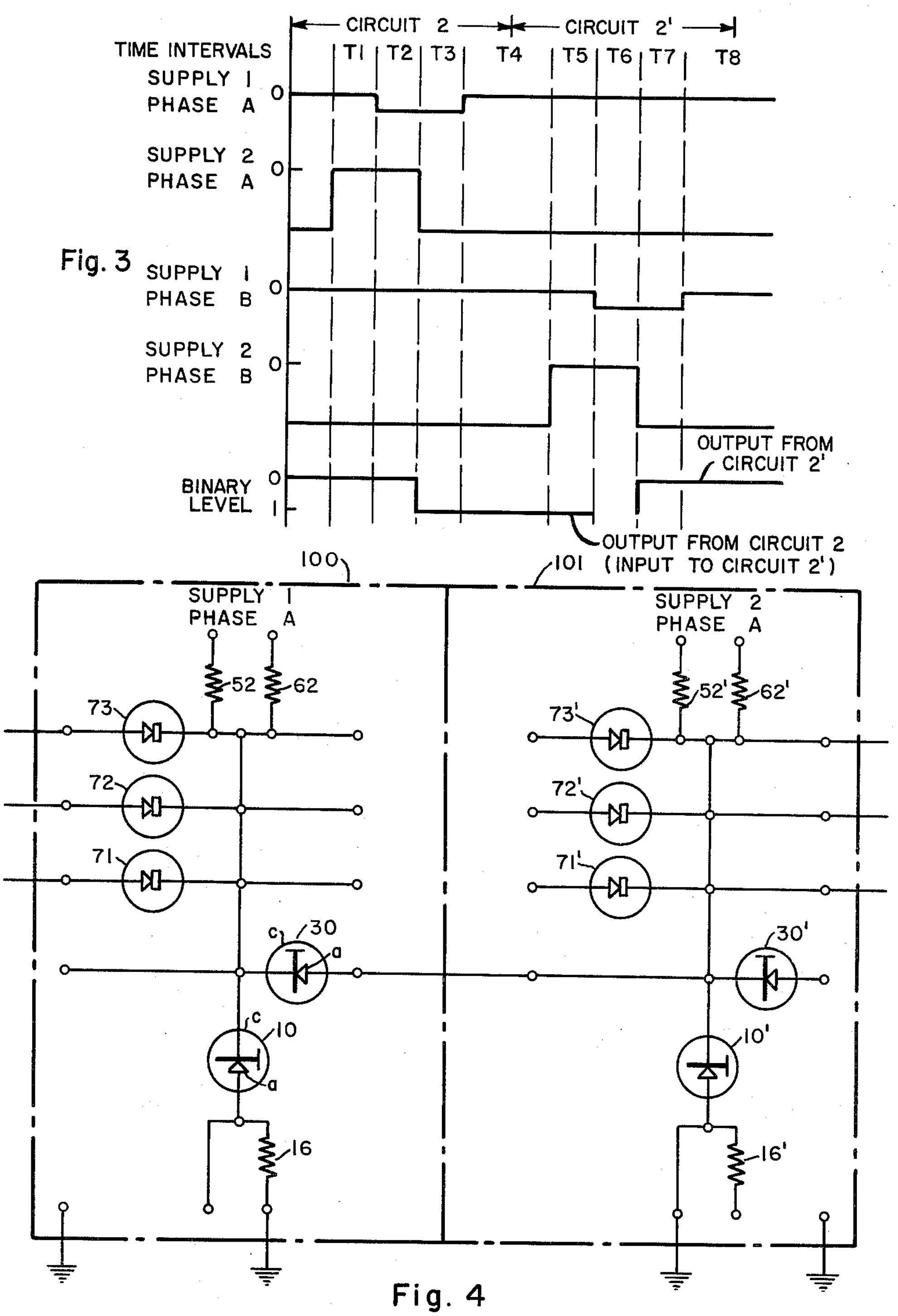
FIG. 3 illustrates the time sequence of pulses from the clock source illustrated in FIG. 1; and, FIG. 4 is an alternate embodiment of the present invention.

A clock pulse source 90 is a synchronized clock pulse type of power supplies 1 and 2 each having an A phase and a B phase poled to provide negative pulses in a sequence illustrated in FIG. 3.

A plurality of input means 70A, 70B, . . . 70C each comprising a backward diode 71, 72 and 73, respectively are individually connected to the junction 50. It is to be understood that while three input means 70 have been illustrated, any suitable number may be so connected. An output means comprising an output terminal 80 is connected to the junction 60.

Binary "negative" logic has been utilized to illustrate the present invention. That is, a first signal level is designated "zero" and may be substantially at ground potential while a more negative signal is designated as the binary "one."

For a clearer understanding of the present invention, it is to be understood that the NOR logic function provides an output only when a binary "zero" is present at all terminals 70A, 70B and 70C. However, should a binary "one" input be present at one or more of the input means 70, no output will occur from the logic circuit 2.

Figure 2:
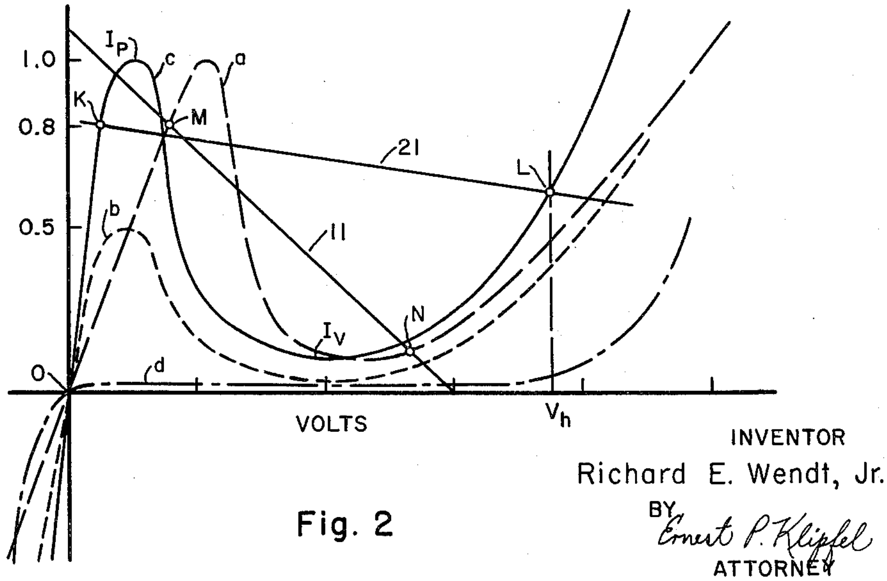
FIG. 2 illustrates characteristic curves of certain devices shown in the illustrative embodiment of FIG. 1.

A characteristic curve *a*, *c* and *b* for each tunnel diode 10, 20 and 30 respectively and a curve *d* for the backward diodes 71, 72 and 73 have been illustrated in FIG. 2. Curve *c* for the tunnel diode 20 is selected for discussion since it is representative of characteristics similar to each tunnel diode of the NOR logic circuit 2. For reverse bias, the resistance of the tunnel diodes is small. In the forward direction of voltage across the tunnel diode, the current therethrough increases to a sharp maximum $I_p$ on a portion of the characteristic curve to be referred to as the low voltage side or state. Further increase in the voltage across the diode results in the negative resistance portion of the characteristic curve wherein the current through the diode drops to a deep and broad minimum, referred to as the valley current $I_v$. Still further increase in the voltage across the diode causes the current to increase again on a portion of the characteristic curve to be referred to as the high voltage side or state. The current increases to a maximum value L determined by the maximum voltage $V_h$ appearing across the diode as determined by the circuit parameters of the logic element and the clock pulse source 90. The breakover current level is determined by the peak tunneling current $I_p$ and is referred to as the threshold or excitation level of the tunnel diode. For the purposes of this invention, the term tunnel diode is herein meant to include all devices exhibiting the aforementioned characteristics.

The characteristic curve *a* for the tunnel diode 10 has been skewed to move the peak current $I_p$ to a higher voltage as determined by the magnitude of the resistive element 16 connected in series circuit relationship therewith. The characteristic curve *b* of the tunnel diode 30 is selected to have a current threshold level $I_p$ substantially less than the current threshold level of the tunnel diodes 10 and 20 and is chosen to be approximately one half on a per unit current basis.

The characteristic curve *d* of the backward diode 71 has a substantially infinite impedance portion in the forward quadrant wherein only excess current exists. For a reverse voltage thereacross, breakdown occurs as with the usual tunnel diode, resulting in appreciable current flow when reversed voltage is connected across the backward diode 71. Little current will flow with the same magnitude of voltage connected in the forward direction across the diode. The high speed conduction characteristics of the backward diode 71, which are also attributable to the quantum mechanical tunneling effect, makes these devices compatible with the high speed switching characteristics of the tunnel diodes utilized in the NOR logic circuit 2.

Adjustment of resistance of the backward diodes insures that only a just-adequate amount of current flows, with the potential difference available, to switch diode 10 reliably without also switching diode 20.

Briefly, the NOR logic circuit 2 shown in FIG. 1 provides tunnel diodes capable of switching from a low voltage state to a high voltage state when the sum of the connected supply and input currents exceeds the current threshold level of particular tunnel diodes. To prevent signals feeding back to earlier stages, the backward diodes in each input means for the logic circuit 2 are used to block in the normal forward direction and conduct in the normal reverse direction by the same tunneling process as the tunnel diode. Their inclusion, therefore, is not a seriously limiting factor on attainable speed.

Assuming that the voltage output of a preceding NOR logic circuit, not illustrated, corresponds to the operating point K which is a low voltage state and consequently a binary "zero" input to the NOR logic circuit 2, the tunnel diode 10 will experience very little current therethrough during the time interval T1 when the supplies 1 and 2 are turned off. At the beginning of interval T2 supply 1 is turned on thereby permitting the output state herein designated to be the low voltage state or binary "zero" of the preceding logic circuit, to be impressed on the tunnel diode 10. The current through the tunnel diode 10 will still be insufficient to exceed its current threshold value and will therefore remain at its low voltage state indicated as point M on the characteristic curve *a* of FIG. 2. The voltage OM circulates current through the tunnel diodes 20 and 30 connected in series circuit relationship across the diode 10. The current so circulated is less than the threshold current level of the third tunnel diode 30, and the second tunnel diode 20 but is sufficient in magnitude to switch the tunnel diode 20 to its high voltage stage, point L, determined by the load line 21 when combined with the Supply 2, Phase A at time interval T3. The diode 20 is energized by the combination of current therethrough from the voltage OM across the tunnel diode 10 and the second supply when it is energized at the beginning of the time interval T3. Accordingly, the high voltage output, or binary "one," is attained from the NOR logic circuit 2 when binary "zeroes" are present at all the input means 70.

Assuming now that there is a binary "one" input signal to one or more of the input means 70′, corresponding to the operating point L of the logic module 2, the tunnel diode 10′ will switch to its high voltage state shown as the operating point N at the beginning of the time interval of T6. This voltage will be sufficient to pass current in excess of the current threshold level of the tunnel diode 30′ through the tunnel diodes 30′ and 20′. As soon as the current threshold level of the tunnel diode 30′ is exceeded, that diode will switch to its high voltage state having a magnitude somewhat less than the high votlage state N of the tunnel diode 10′ so that the available voltage from the diode 10′ is insufficient to cause enough current to exceed the current threshold level of the tunnel diode 20′ even when the second supply begins during the time interval T7. Therefore, the tunnel diode 20′ will assume the operating point K, its low voltage state. The output terminal 80′ connected to the junction 60 will then provide a low voltage for binary "zero" from the logic circuit 2′.

In summation, it can be seen that a high voltage or binary "one" into any one or more of the input means 70 produces a low voltage output or binary "zero" at the output terminal 80 while binary zeroes into all input means will produce a binary "one" at its output terminal. Such is the NOR logic function, which is usuable as a universal logic element to construct all required combinations in a logic net.

It has been found feasible to make the five junctions required for backward diodes 71, 72 and 73 and tunnel diodes 10 and 30 all at once on one piece of germanium dendrite. Accordingly, from FIG. 4 it can be seen that logic modules or circuits with external resistors can be made in the form shown therein with the combination of two such pieces of germanium dendrite 100 and 101 combining to perform a NOR logic function. Each piece is identically manufactured providing many manufacturing advantages. Parallel circuits are provided for connection either to the first supply or the second supply and to include or omit the skewing resistor 16. When desirable, the connecting resistors 52 and 62 may be replaced with the diode junctions and an increase in the series resistance of the tunnel diode 10 can be used to essentially incorporate the resistance magnitude of the resistive element 16. Accordingly an all-semiconductor module is attainable which is a very desirable approach in molecular circuitry.

It is now readily apparent that the present invention has provided a NOR logic circuit with its many attendant advantages while in turn providing a logic circuit having inherently low cost and excellent adaptability to automatic production. Unilateral signal flow through the logic net is attainable and all of the advantages of the tunnnel diode are utilized.

While this invention has been described with a particular degree of exactness for the purposes of illustration, it is to be understood that all equivalents, alterations, and modifications within the spirit and scope of the present invention are herein meant to be included.

I claim as my invention:

1. In a logic circuit adapted to be connected to a clock pulse source having a first supply and a second supply; a first tunnel diode means and a second tunnel diode means each having substantially equal current threshold values; means for sequentially connecting said first supply and said second supply to said first tunnel diode means and said second tunnel diode means respectively; a plurality of input means each responsive to an input signal and connected to said first tunnel diode means for individually combining with said first supply to breakover said first tunnel diode; a third tunnel diode means interconnecting said first and said second tunnel diode means and having a current threshold value substantially less than the other tunnel diode means; said third tunnel diode means poled to breakover only when said current threshold of said first tunnel means is exceeded, whereby the current through said second tunnel diode means is insufficient in the presence of said second supply to exceed the current threshold of said second tunnel diode means; and output means responsive to the condition of said second tunnel diode means for providing an output signal.

2. In a logic circuit adapted to be connected to a clock pulse source having a first supply and a second supply; a first tunnel diode means and second tunnel diode means each having substantially equal current threshold values; means for sequentially connecting said first supply and said second supply to said first tunnel diode means and said second tunnel diode means respectively; a plurality of input means each responsive to an input signal and connected to said first tunnel diode means for individually combining with said first supply to exceed the current threshold value of said first tunnel diode means; output means connected to said second tunnel diode means; third tunnel diode means interconnecting said first and said second tunnel diode means and having a current threshold value substantially less than said first and said second tunnel diode threshold values, the threshold value of said third tunnel diode means being exceeded when the threshold value of said first tunnel diode means is exceeded whereby the combination of current through said second tunnel diode means and said second supply is insufficient to exceed the threshold value of said second tunnel diode means but the current through said third tunnel diode means is sufficient to exceed its threshold level in the absence of an input signal to all said plurality of input means.

3. The apparatus of claim 2 wherein each said plurality of input means comprises a backward diode poled to allow current from said first tunnel diode means only.

4. In a logic circuit operative with a clock pulse source having a first supply and a second supply; first, second and third condition responsive semiconductor means each having a characteristic operating curve of a first and second positive resistance regions separated by a negative resistance region and each having a respective threshold value; each semiconductor means providing a first output when the condition is insufficient to exceed its respective threshold value and providing a second output when the condition exceeds its respective threshold value; a plurality of input means each responsive to an input signal and connected to said first semiconductor means for individually combining with said first supply for providing a condition to said first semiconductor means exceeding its threshold value; said third semiconductor means interconnecting said first and said second semiconductor means and poled to have a condition thereacross exceeding its respective threshold value thereby providing its second output when the threshold level of said first semiconductor means is exceeded; said second semiconductor means connected to said third semiconductor means for combining the output of said third semiconductor means with said second supply to provide a condition to said second semiconductor means exceeding its threshold value only when the condition across said third semiconductor means is insufficient to exceed its threshold value; and means responsive to the output state of said second semiconductor means for providing an output signal.

5. In a logic circuit adapted to be connected to a clock pulse source having a first supply and a second supply; a first tunnel diode and a second tunnel diode each having substantially equal current threshold values and each having a low voltage and a high voltage state; a plurality of input means each responsive to an input signal of said high voltage state and connected to said first tunnel diode for individually combining with said first supply to exceed the threshold value of said first tunnel diode causing said first tunnel diode to assume said high voltage state; a third tunnel diode interconnecting said first and said second tunnel diode and having a current threshold value substantially less than said other tunnel diodes and a high voltage state and a low voltage state; said third tunnel diode poled so that its threshold is exceeded thereby assuming its high voltage state when said first tunnel diode assumes its high voltage state; said second tunnel diode poled to receive said second supply and assume its low voltage state only when said third tunnel diode assumes its high voltage state; and output means connected to provide an output in accordance with the voltage state of said second tunnel diode.

6. In a logic circuit adapted to be connected to a clock pulse source having a first supply and a second supply; a first tunnel diode and a second tunnel diode each having substantially equal current threshold values and each having a respective low voltage state prior to its respective threshold value being exceeded and a respective high voltage state after its respective threshold value is exceeded; means for sequentially connecting said first supply and said second supply to said first tunnel diode and said second tunnel diode respectively; a plurality of input means connected to said first tunnel diode for individually providing a binary "one" for combination with said first supply to exceed the threshold value of said first tunnel diode and causing said first tunnel diode to assume its high voltage state; a third tunnel diode interconnecting said first and said second tunnel diode and having a current threshold value substantially less than said other tunnel diodes and having a respective low voltage state prior to its threshold value being exceeded and a high voltage state after its threshold value is exceeded; said third tunnel diode poled to assume its high voltage state when said first tunnel diode assumes its respective high voltage state; said second tunnel diode poled to assume its low voltage state when said third tunnel diode means assumes its high voltage state; the combination of current through said third tunnel diode and said second tunnel diode in combination with said second supply being insufficient to exceed the threshold value of said second tunnel diode; and output means operably connected to said second tunnel diode to provide a binary "zero" output signal when said second tunnel diode is in its low voltage state and a binary "one" output signal when said second tunnel diode is in its high voltage state.

7. A logic circuit, including a plurality of input means, for providing a binary "one" output when a binary "zero" input is present at each said input means of said logic circuit and providing a binary "zero" output when a binary "one" input is present at one or more of said input means of said logic circuit comprising, in combination; a first tunnel diode connected to each of said input means and having a high voltage and a low voltage state; means for connecting a first power supply to said first tunnel diode; said first tunnel diode assuming its high voltage state upon the coincidence of a binary "one" input at any one or more of said input means and a pulse from said first power supply; a second and a third tunnel diode connected in series circuit relationship across said first tunnel diode; said third tunnel diode assuming its high voltage state when said first tunnel diode assumes its high voltage state; means for connecting a second power supply to said second tunnel diode; said second tunnel diode assuming its high voltage state upon the coincidence of a pulse from said second power supply and the low voltage state of said third tunnel diode; and output means operably connected to the junction of said second and third tunnel diodes for providing a binary "one" output in accordance with the high voltage state of said second tunnel diode and a binary "zero" output in accordance with the low voltage state of said second tunnel diode.

8. In a logic circuit including a plurality of input means and adapted to be connected to a clock pulse source having a first supply and a second supply for providing a binary "one" output when a binary "zero" signal is present at each said input means of said logic circuit and providing a binary "zero" output when a binary "one" signal is present at one or more of said input means of said logic circuit comprising, in combination; a first tunnel diode connected to each of said input means and having a high voltage state and a low voltage state; said first tunnel diode assuming its high voltage state upon the simultaneous presence of said first supply and a binary "one" signal at any one or more of said input means; a second and a third tunnel diode connected in series circuit relationship across said first tunnel diode; said third tunnel diode assuming its high voltage state when said first tunnel diode assumes its high voltage state; said second tunnel diode operably connected to said second supply and having a current threshold value selected to be greater than the combination of said second supply and the current through said third tunnel diode when said third tunnel diode assumes its respective high voltage state; and output means operably connected across said second tunnel diode for providing a binary "one" output in accordance with the high voltage state of said second tunnel diode and providing a binary "zero" output in accordance with the low voltage state of said second tunnel diode.

9. The apparatus of claim 8 wherein each said input means comprises a backward diode poled to provide substantially infinite impedance to current flow towards said first tunnel diode whereby spurious signals in the logic system will be blocked.

10. The apparatus of claim 8 including resistance means in series circuit relationship with said first tunnel diode for increasing the magnitude of the voltage across said first tunnel diode at its respective threshold value relative to the voltage across said second tunnel diode when at its respective threshold value.

11. A logic circuit adapted to be connected to a clock pulse source having a first supply and a second supply; a first tunnel diode and a second tunnel diode; a resistance connecting one end of said first tunnel diode to a point of reference potential; means connecting the like end of said second tunnel diode to said point of reference potential; a third tunnel diode connecting the opposite ends of said first and second tunnel diodes and poled to have its like end connected to the opposite end of said second tunnel diode; second resistance means for connecting said first supply to the junction of said first and third tunnel diodes; third resistance means for connecting said second supply to the junction of said second and third tunnel diodes; output means connected to the junction of said second and third tunnel diodes; a plurality of input means each connected to the junction of said first and third tunnel diodes; each said input means comprising a backward diode poled to allow current from said junction between said first and third tunnel diodes and provide substantially infinite impedance over a preselected range of current through its associated input means to said junction common to said first and third tunnel diodes; the combination of said first supply and a binary "one" signal at one or more of said input means being sufficient to exceed the threshold value of said first tunnel diode causing said first tunnel diode to assume a high voltage state; the current through said third tunnel diode being sufficient to exceed its respective threshold value and assume its respective high voltage state upon said first tunnel diode assuming its high voltage state; said scond tunnel diode having a selected threshold value greater than the combination of said second supply and the current through said third tunnel diode when said third tunnel diode is in its respective high voltage state but said second tunnel diode assuming its high voltage state upon the simultaneous occurrence of said second supply and the low voltage state of said third tunnel diode; and output means operably connected to the junction of said second and third tunnel diode means for providing a binary "one" output in accordance with the high voltage state of said second tunnel diode and providing a binary "zero" output state in accordance with the low voltage state of said second tunnel diode.

12. As a new article of manufacture a logic element incorporated into a self-contained monolithic block comprising, first tunnel diode means having a first anode and a first cathode and having a predetermined current threshold level; second tunnel diode means having a second anode and a second cathode and having a current threshold level substantially less than said predetermined current threshold level; input means including a plurality of backward diodes each having a third anode and a third cathode; means for connecting all the cathodes to a common junction; terminal means for selectively connecting said common junction to a power supply through a first resistance element and a second resistance element;

means for selectively connecting said first anode directly to a point of reference potential and through a resistance element to the point of reference potential; and output terminal means connected to said second anode and responsive to the combination of an input signal at any third anode and the power supply to provide an output signal.

13. A logic circuit configuration adapted to be built into two self-contained monolithic blocks, each self-contained monolithic block comprising, a first tunnel diode means having a first anode and a first cathode and having a predetermined current threshold level; a second tunnel diode means having a second anode and a second cathode and having a current threshold level substantially less than said predetermined current threshold level; input means including a plurality of backward diodes each having a third anode and a third cathode; means for connecting all the cathodes to a common junction; means for connecting the common junction of one monolithic block to a first power supply; means for connecting the common junction of the other monolithic block to a second power supply; means for connecting the first anode of said one monolithic block through a resistance element to a point of reference potential; means for connecting said first anode of the other monolithic block directly to a point of reference potential; means connecting the second anode of said one monolithic block to the common junction of said other monolithic block; and output means connected to the second anode of said other monolithic block for providing a first output signal upon the combination of an input signal at any third anode of said one monolithic block and the sequencing of power supplies to said one monolithic block and said other monolithic block respectively.

References Cited by the Examiner

UNITED STATES PATENTS 3,054,002 9/62 Tendick ------------- 307—88.5

OTHER REFERENCES

A.I.E.E. Conference Paper entitled "Tunnel Diode Aspects and Applications" by Chow et al., Paper No. CP 60–297, pages 15 and 26, January 1960.

ARTHUR GAUSS, *Primary Examiner.*

JOHN W. HUCKERT, *Examiner.*